(12) United States Patent
Faber et al.

(10) Patent No.: US 12,405,321 B2
(45) Date of Patent: Sep. 2, 2025

(54) SYSTEM AND METHOD FOR DETERMINING A CABLE WEAR STATUS

(71) Applicant: Festo SE & Co. KG, Esslingen (DE)

(72) Inventors: Eduard Faber, Stuttgart (DE); Danny Schneider, Lichtenwald (DE); Thilo Streichert, Stuttgart (DE); Silvia Starz, Weinstadt (DE)

(73) Assignee: Festo SE & Co. KG, Esslingen (DE)

( * ) Notice: Subject to any disclaimer, the term of this patent is extended or adjusted under 35 U.S.C. 154(b) by 64 days.

(21) Appl. No.: 18/014,209

(22) PCT Filed: Jan. 28, 2021

(86) PCT No.: PCT/EP2021/051907
§ 371 (c)(1),
(2) Date: Jan. 3, 2023

(87) PCT Pub. No.: WO2022/002442
PCT Pub. Date: Jan. 6, 2022

(65) Prior Publication Data
US 2023/0266406 A1 Aug. 24, 2023

(30) Foreign Application Priority Data
Jul. 3, 2020 (DE) ..................... 10 2020 208 394.0

(51) Int. Cl.
*G01R 31/58* (2020.01)
*G05B 23/02* (2006.01)

(52) U.S. Cl.
CPC ......... *G01R 31/58* (2020.01); *G05B 23/0283* (2013.01)

(58) Field of Classification Search
USPC ................................................ 324/539–544
See application file for complete search history.

(56) References Cited

U.S. PATENT DOCUMENTS

| 7,023,217 B1 * | 4/2006 | Wong ..................... G01R 31/58 324/424 |
| 7,725,295 B2 | 5/2010 | Stoupis et al. |

(Continued)

FOREIGN PATENT DOCUMENTS

| DE | 10 2016 210 615 A1 | 12/2017 |
| DE | 10 2018 008 370 A1 | 5/2019 |

(Continued)

OTHER PUBLICATIONS

International Search Report.
(Continued)

*Primary Examiner* — Farhana A Hoque
(74) *Attorney, Agent, or Firm* — Hoffmann & Baron, LLP

(57) ABSTRACT

A system (10) for industrial automation, including a field device (1) with a function unit (2), in particular an actuator unit, sensor unit and/or control unit, which is configured to provide a function in accordance with a received payload (ND), and a communication unit (3) for receiving a payload signal (DS) containing the payload (ND) via a cable (4), the communication unit (3) being configured to provide a parameter set (PS) on the basis of the payload signal (DS) and to carry out signal processing of the payload signal (DS) using the parameter set (PS) in order to obtain the payload (ND) from the payload signal (DS), the system (10) further comprising a diagnosis device (5) which is configured to determine a cable wear condition of the cable (4) in accordance with an indicator variable (IG) based on the parameter set (PS).

16 Claims, 3 Drawing Sheets

(56) References Cited

U.S. PATENT DOCUMENTS

| | | | |
|---|---|---|---|
| 7,864,694 B1 | 1/2011 | Rosselot et al. | |
| 2010/0183313 A1* | 7/2010 | Rhodes | H04B 13/02 |
| | | | 398/104 |
| 2012/0314130 A1* | 12/2012 | Ritter | H04N 5/208 |
| | | | 348/E5.062 |
| 2014/0303906 A1* | 10/2014 | Charlot | G01R 31/083 |
| | | | 702/59 |
| 2014/0347070 A1 | 11/2014 | Scheuschner et al. | |
| 2018/0080971 A1 | 3/2018 | Gariboldi | |
| 2019/0044626 A1* | 2/2019 | Hewavithana | H04L 25/0222 |
| 2019/0120706 A1 | 4/2019 | Janssen et al. | |
| 2019/0129381 A1 | 5/2019 | Tanno et al. | |
| 2021/0116317 A1 | 4/2021 | Krista | |
| 2022/0014232 A1 | 1/2022 | Habering et al. | |
| 2022/0085583 A1* | 3/2022 | Gundel | H02G 1/1248 |

FOREIGN PATENT DOCUMENTS

| | | |
|---|---|---|
| DE | 20 2017 007 067 U1 | 6/2019 |
| DE | 20 2018 106 543 U1 | 12/2019 |
| WO | 2018/196949 A1 | 11/2018 |

OTHER PUBLICATIONS

German Examination Report.
LAPP Predictive Maintenance Box—https://www.lappkabel.de/predictive-maintenance-box.html, Apr. 20, 2020.

* cited by examiner

SYSTEM AND METHOD FOR DETERMINING A CABLE WEAR STATUS

This is a National Stage application based on International Application No. PCT/EP2021/051907, filed on Jan. 28, 2021, which claims priority to DE 102020208394.0, filed Jul. 3, 2020.

BACKGROUND OF THE INVENTION

The invention relates to a system for industrial automation, comprising a field device with a function unit, in particular an actuator unit, sensor unit and/or control unit, which function unit is configured to provide a function according to a received payload, and a communication unit for receiving a payload signal containing the payload via a cable. The communication unit is configured to provide a parameter set based on the payload signal and to perform signal processing of the payload signal using the parameter set in order to obtain the payload from the payload signal.

The cable is a bus cable, for example. The cable may also be referred to as a data transmission cable. The cable is expediently arranged in a drag chain and/or is subject to mechanical stress, such as tension, torsion, or bending, which degrades the transmission characteristics of the cable over time. For example, the system includes an actuator device by which the cable is set in a cable movement. Further, temperature and/or humidity may stress the cable and cause deterioration of the transmission properties. In particular, mechanical deformation of the cable may affect the high-frequency transmission characteristics of the cable. The cable expediently has a symmetrical geometry and is designed, for example, as a star quad cable or twisted pair cable. Deformation of the cable disturbs the geometry of the cable and, for example, increases crosstalk between pairs of wires of the cable. Furthermore, a dielectric of the cable—i.e. the sheathing of a core of the cable—can be damaged by the stress on the cable, since cracks form in the dielectric, for example, which interfere with the transmission of electromagnetic waves.

Due to the load on the cable, the cable experiences cable wear. From a certain cable wear condition (for example, after a certain period of use), transmission errors can occur up to a failure of the transmission link provided by the cable.

Conventionally, the cable is replaced regularly according to a maintenance schedule, especially before it reaches a critical cable wear condition—that is, a cable wear condition at which transmission of the payload signal over the cable is no longer possible.

It is known to provide the cable with a sacrificial core (an additional, weaker core). If a break in the sacrificial core is detected, a cable wear condition can be concluded, in which case the cable must be replaced.

The company U.I. Lapp GmbH has announced a "Lapp Predictive Maintenance Box" that can be plugged into a data line in series and monitors whether the transmission properties of a line are deteriorating.

U.S. Pat. No. 7,864,694 B1 describes a system and method for monitoring the quality of a data link in a 100 Mb Ethernet physical layer device. A link quality monitoring unit acquires operational values of data link parameters. When an operational value of a data link parameter exceeds a high or low threshold, the link quality monitoring unit outputs a termination link signal to cause a current data link to be terminated and a new data link to be established.

SUMMARY OF THE INVENTION

It is an object of the invention to provide a reliable system for industrial automation.

The object is solved by the system according to claim 1. The system comprises a diagnosis device adapted to determine a cable wear condition of the cable according to an indicator variable based on the parameter set.

The indicator variable is a mapping of the parameter set. For example, the indicator variable is based on a single, several or all parameters of the parameter set. Preferably, the indicator variable is based on a sum of multiple parameters of the parameter set. Further, it is possible for the indicator variable to represent a single parameter, a plurality of parameters, or all parameters of the parameter set. For example, the parameter set itself can also be used as the indicator variable.

The determination of the cable wear condition is thus expediently based (via the indicator variable) on that parameter set which is already used to receive the payload. The parameter set includes as a parameter, for example, one or more coefficients of an equalizer unit which is used for signal processing of the payload signal. The equalizer unit may also be referred to as an equalizer. The equalizer unit serves to compensate for attenuation of the payload signal caused by the cable, in particular attenuation that depends on the frequency. For example, the cable attenuates high frequencies more than low frequencies. The equalizer unit serves in particular to compensate for the attenuation of the high frequencies. The parameter set and/or the indicator variable is expediently related to a transmission characteristic, in particular an attenuation, of the cable. For example, the parameter set and/or the indicator variable indicates how strong the attenuation of the payload signal caused by the cable is. In particular, the parameter set and/or the indicator variable indicates the strength of a compensation of the attenuation of the payload signal. The transmission characteristic, in particular the attenuation, of the cable is related to the cable wear condition. Consequently, the cable wear condition can be determined based on the indicator variable based on the parameter set.

In particular, a non-critical cable wear condition can be determined as the cable wear condition, in which the transmission property of the cable is already deteriorated, but the payload signal can still be transmitted. The system is configured to indicate that the cable needs to be replaced as soon as the non-critical cable wear condition is present. In this way, it can be prevented that the cable wears further to a critical cable wear condition, at which the payload signal can no longer be transmitted and consequently failures and/or malfunctions can occur in the system.

Consequently, by determining the cable wear condition, it becomes possible to identify a cable that needs to be replaced due to wear at an early stage, before this cable causes failures and/or malfunctions in the system. Thus, the reliability of the system can be improved.

The parameter set and/or the indicator variable is provided by the field device itself. Thus, no further unit is required (in addition to the field device) to provide the parameter set and/or the indicator variable. The field device is present to provide the function related in particular to the industrial manufacturing process. Thus, the field device is already present in the system for a reason other than determining the cable wear condition. The field device is, for example, a control unit for a drive, a motor controller, a control unit for reading a sensor, a sensor unit, a camera and/or an actuator unit.

Advantageous further developments are defined in the dependent claims.

The invention further relates to a method for determining a cable wear condition of a cable, comprising the steps of:

receiving, at a field device, a payload signal, providing a parameter set based on the payload signal, performing signal processing of the payload signal using the parameter set to obtain a payload from the payload signal, by means of a function unit, in particular an actuator unit, sensor unit and/or control unit, of the field device, providing a function according to the payload, and determining a cable wear condition of the cable according to an indicator variable based on the parameter set.

Preferably, the method is carried out with the described system for industrial automation. According to a preferred embodiment, the method is designed in accordance with a further development of the system.

BRIEF DESCRIPTION OF THE DRAWINGS

Further exemplary details as well as exemplary embodiments are explained below with reference to the figures. Thereby shows FIG. 1 a schematic representation of a system for industrial automation, FIG. 2 a schematic representation of a field device and FIG. 3 a temporal course of an indicator variable.

DETAILED DESCRIPTION

Figure 1:
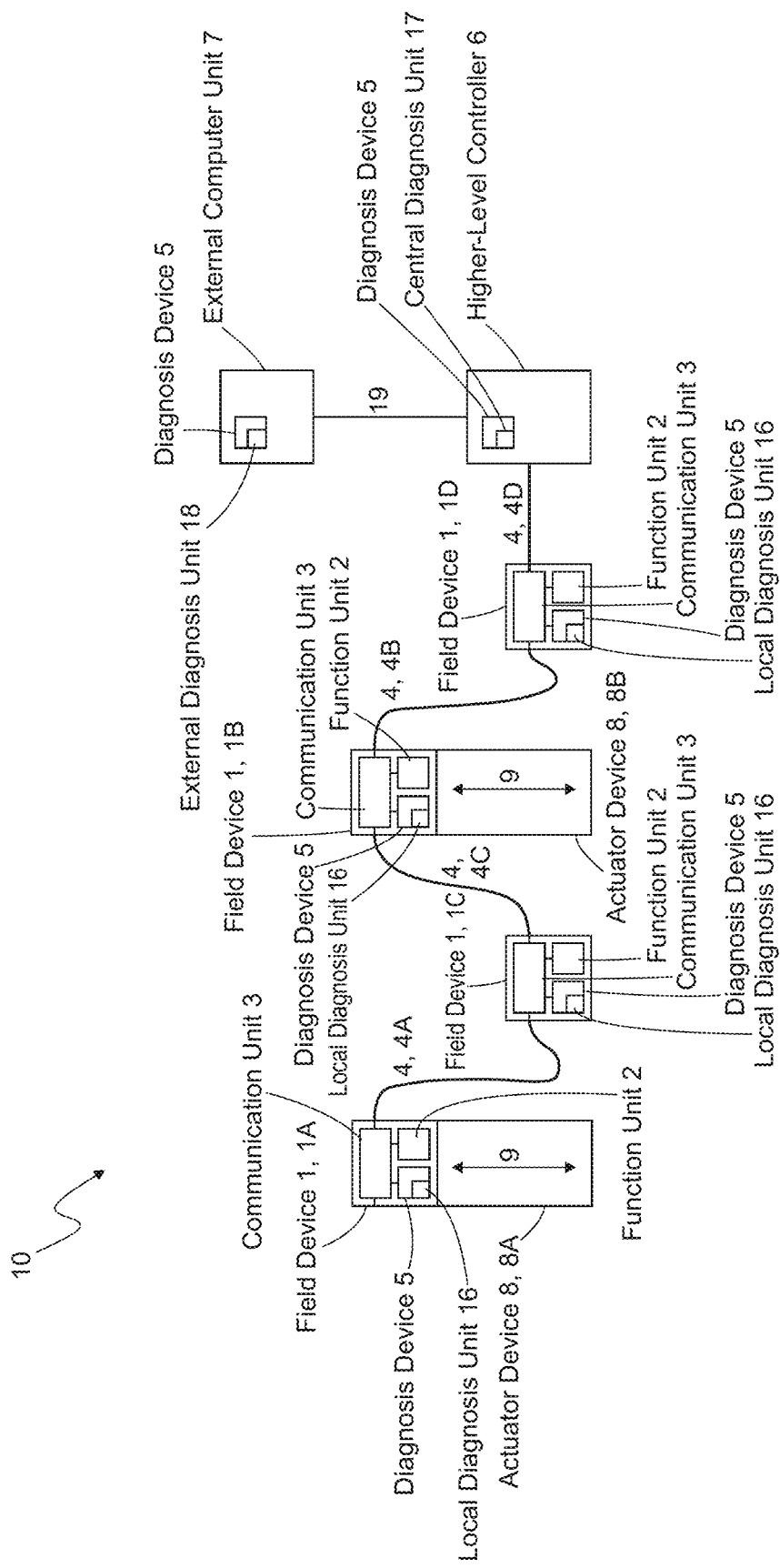

FIG. 1 shows a system 10, in particular for use in industrial automation. The system 10 may also be referred to as an industrial system. For example, the system 10 is used in an industrial manufacturing process. For example, the system 10 is an industrial production line.

The system 10 comprises at least one field device 1. Preferably, the system 10 comprises a plurality of field devices 1. Exemplarily, the field devices 1 comprise a first field device 1A, a second field device 1B, a third field device 1C, and/or a fourth field device 1D.

The following explanations relating to the field device 1 expediently apply respectively to several, preferably all, of the field devices 1A, 1B, 1C, 1D.

The field device 1 comprises a function unit 2. The function unit 2 comprises, for example, an actuator unit, a sensor unit and/or a control unit. The function unit 2 is configured to provide a function according to a received payload ND.

Preferably, the function unit 2 is designed as an actuator unit, for example as an electric or pneumatic actuator, and is designed to provide, as the function, a drive, in particular a movement, in accordance with the payload ND. The payload is, for example, control data for the actuator unit and, in particular, specifies the drive to be provided, in particular the movement. For example, the actuator unit is an electro-pneumatic converter.

Furthermore, the function unit 2 can be designed as a sensor unit and serve, for example, to detect a physical quantity related in particular to an industrial manufacturing process as the function. The sensor unit is expediently designed to carry out the detection of the physical quantity in accordance with the received payload.

Furthermore, the function unit 2 can be designed as a control unit, and is in particular designed to control an actuator device 8 in order to cause the actuator device 8 to perform a movement 9 as the function. In particular, the control unit is configured to perform the control based on the payload ND. For example, the payload ND specifies the control of the actuator device 8 to be performed.

The field device 1 further comprises a communication unit 3 for receiving a payload signal DS containing the payload ND. The field device 1 is expediently connected to a bus, in particular a field bus, via the communication unit 3. The field device 1 is expediently a field bus subscriber. The communication unit 3 receives the payload signal DS via a cable 4. The cable 4 is connected to the field device 1 by way of example. The cable 4 is expediently part of a bus, in particular an industrial bus, preferably a field bus. The cable 4 may also be referred to as a bus cable.

The communication unit 3 is configured to provide a parameter set PS based on the payload signal DS, and to perform signal processing of the payload signal DS using the parameter set PS to obtain the payload ND from the payload signal DS.

The system 10 further comprises a diagnosis device 5 configured to determine a cable wear condition of the cable 4 according to an indicator variable IG based on the parameter set PS.

In the following, the exemplary structure of the system 10 shown in FIG. 1 will be discussed in more detail.

Exemplarily, the system 10 comprises a higher-level controller 6, which is designed, for example, as a programmable logic controller, PLC. The higher-level controller 6 is communicatively connected to the field devices 1, in particular via a bus, which expediently runs via one or more cables 4. The higher-level controller 6 is expediently designed to provide a payload signal that contains a payload directed to one or more field devices 1, and to transmit the payload signal to the one or more field devices 1 via the one or more cables 4.

Preferably, the system 10 comprises a plurality of cables 4. Exemplarily, the cables 4 comprise a first cable 4A, a second cable 4B, a third cable 4C, and a fourth cable 4D. Each cable 4 is expediently connected to an input of a respective field device 1. The first cable 4A is connected to an input of the first field device 1A. The second cable 4B is connected to an input of the second field device 4B. The third cable 4C is connected to an input of the third field device 4C. The fourth cable 4D is connected to an input of the fourth field device 4D. By way of example, the first cable 4A connects the first field device 1A to the third field device 1C, the second cable 4B connects the second field device 1B to the fourth field device 1D, the third cable 4C connects the third field device 1C to the second field device 1B, and the fourth cable 4D connects the fourth field device to the higher-level controller 6.

By way of example, the field devices 1 (and expediently the higher-level controller 6) are connected in series with one another via the cables 4—i.e. in particular in a line topology. Alternatively, the field devices 1 (and expediently the higher-level controller 6) can be connected via the cables 4 in a different topology.

The system 10 preferably comprises at least one actuator device 8, which is designed to provide a movement 9. Exemplarily, the system comprises several actuator devices 8, each of which provides a respective movement 9. Exemplarily, each movement 9 causes a respective cable 4 to undergo a respective cable movement. The cable movement can lead to a load and, in particular, to wear of the respective cable 4. Exemplarily, a first actuator device 8A is provided which causes a cable movement of the first cable 4A. Furthermore, exemplary, a second actuator device 8B is present which causes a cable movement of the second cable 4B and/or of the third cable 4C. Exemplarily, the first field device 1A is coupled to the first actuator device 8A, in particular attached to the first actuator device 8A, so that the movement 9 provided by the first actuator device 8A results in a movement of the first field device 1A, causing the cable movement of the first cable 4A. Exemplarily, the second field device 1B is coupled to the second actuator device 8B, in particular attached to the second actuator device 8B, such that the movement 9 provided by the second actuator device 8B results in a movement of the second field device 1A, causing the cable movement of the second cable 4B and/or the third cable 4C.

Preferably, the diagnosis device 5 comprises at least one local diagnosis unit 16 that is part of the field device 1. Expediently, the local diagnosis unit 16 is integrated in the field device 1. In particular, the local diagnosis unit 16 is arranged in a housing 21 of the field device 1. Exemplarily, the diagnosis device 5 comprises a plurality of local diagnosis units 16, each local diagnosis unit 16 being part of a respective field device 1. Each local diagnosis unit 16 is expediently configured to determine locally in the respective field device 1 the cable wear condition according to the respective indicator variable IG based on the respective parameter data set. Preferably, each local diagnosis unit 16 is adapted to provide the indicator variable IG based on the parameter data set.

Exemplarily, the diagnosis device 5 comprises a central diagnosis unit 17, in particular as an alternative to or in addition to the local diagnosis units 16. Exemplarily, the central diagnosis unit 17 is part of the higher-level controller 6. Expediently, the central diagnosis unit 17 is integrated in the higher-level controller 6. In particular, the central diagnosis unit 17 is arranged in a housing of the higher-level controller 6. Expediently, the central diagnosis unit 17 is configured to determine a cable wear condition based on an indicator variable IG of one of the field devices 1. Exemplarily, the central diagnosis unit 17 is configured to determine a respective cable wear condition for a plurality of cables 4 based on a respective indicator variable IG. Exemplarily, the system 10 is configured to transmit at least one, in particular a plurality of parameter sets and/or indicator quantities IG, from one or more field devices 1 to the central diagnosis unit 17, in particular via the bus, preferably via the cables 4. Expediently, the central diagnosis unit 17 is configured to provide a respective indicator variable IG based on each received parameter set.

Exemplarily, the diagnosis device comprises an external diagnosis unit 18, in particular as an alternative or in addition to the local diagnosis units 16 and/or the central diagnosis unit 17. Exemplarily, the external diagnosis unit 18 is part of an external computer unit 7. The external computer unit 7 is, for example, a mobile device, in particular a smartphone or a tablet. Furthermore, the external computing unit 7 may also be an external server, for example a cloud server. The external computer unit 7 is expediently connected to the higher-level controller 6 and/or the field devices 1 via a wide-area network 19, in particular the Internet. Expediently, the external diagnosis unit 18 is designed to determine a cable wear condition based on the indicator variable IG of one of the field devices 1. Exemplarily, the external diagnosis unit 18 is configured to determine, for a plurality of cables 4, a respective cable wear condition based on a respective indicator variable IG. Exemplarily, the system 10 is configured to transmit at least one, in particular a plurality of parameter sets and/or indicator quantities IG, from one or more field devices 1 to the external diagnosis unit 18, in particular via the wide area network 19. Expediently, the external diagnosis unit 18 is configured to provide a respective indicator variable IG based on each received parameter set.

Figure 2:
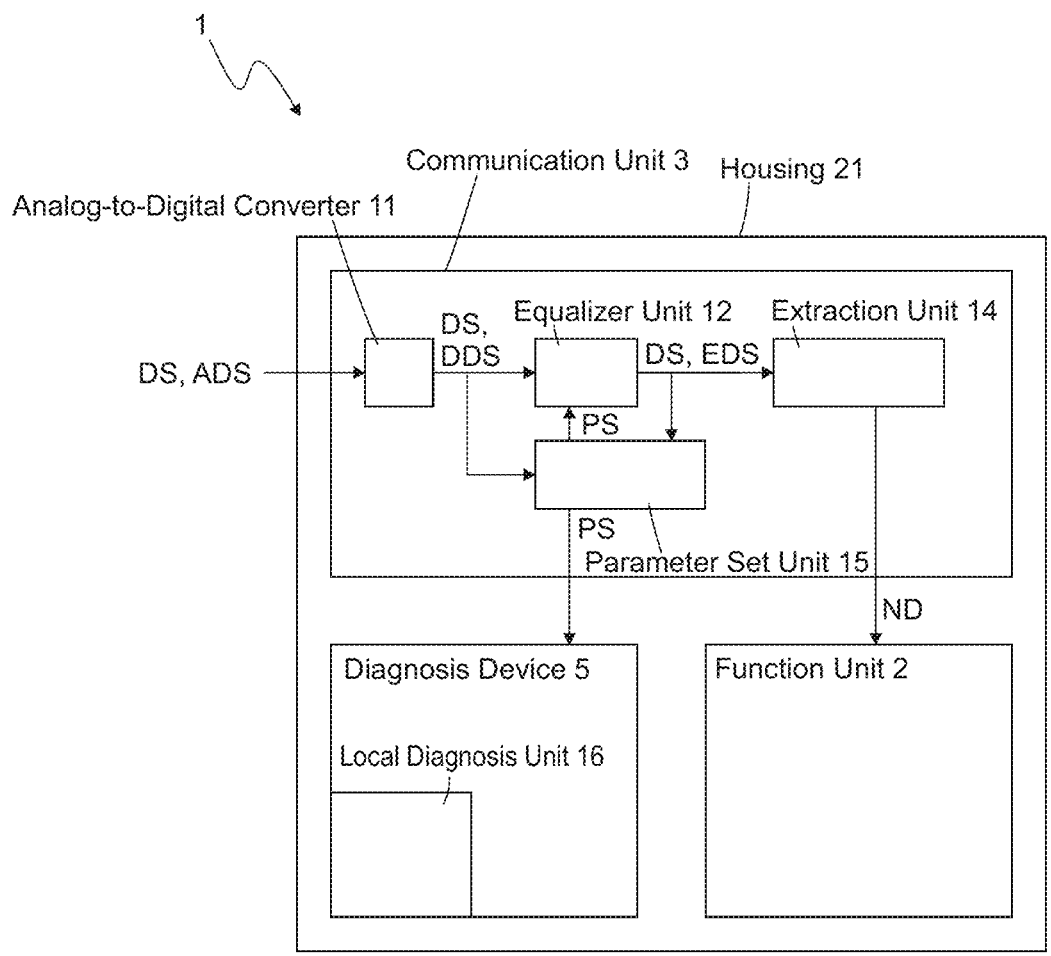

With reference to FIG. 2, the structure of the field device 1 and the signal processing performed in the field device 1 will be discussed in more detail below.

The field device 1 comprises the housing 21, which in particular represents an outer housing of the field device 1. The field device 1 comprises the communication unit 3, the diagnosis device 5 (exemplarily as local diagnosis unit 16 of the diagnosis device 5) and the function unit 2, which are expediently arranged in the housing 21.

The communication unit 3 is designed to provide the parameter set PS on the basis of the received payload signal DS. The parameter set PS is exemplarily related to a transmission characteristic of the cable. For example, the parameter set PS represents an attenuation of the cable 4, which is in particular frequency-dependent. The parameter set comprises one or more parameters, each parameter suitably representing the attenuation of a different frequency band of the payload signal DS.

Exemplarily, the communication unit 3 comprises an equalizer unit 12 which is designed to perform, as the signal processing, signal equalization of the payload signal DS using the parameter set PS. The parameter set preferably comprises, as parameters, coefficients which the equalizer unit 12 uses to equalize the payload signal DS. The equalizer unit 12 may also be referred to as an equalizer. Each coefficient is expediently associated with a respective frequency band and describes the amplification of that frequency band to be performed by the equalizer unit 12. The equalizer unit 12 is designed, for example, as a digital filter, in particular as an FIR filter.

The communication unit 3 comprises, by way of example, a parameter set unit 15 which is designed to provide the parameter set PS on the basis of the payload signal DS. The parameter set unit 15 is designed in particular to provide the parameter set in accordance with an attenuation of the payload signal DS in such a way that signal processing, in particular signal equalization, performed on the basis of the parameter set compensates for the attenuation of the payload signal DS. The parameter set unit 15 is expediently designed as a digital filter, in particular as an FIR filter.

Exemplarily, the communication unit 3 receives the payload signal DS via the cable 4 as an analog payload signal ADS. The communication unit 3 comprises an analog-to-digital converter 11, which converts the analog payload signal ADS into a digital payload signal DDS. The digital payload signal DDS expediently comprises a sequence of signal values which represent the temporal course of the analog payload signal ADS—and thus in particular the signal shape of the analog payload signal ADS. The individual signal values of the digital payload signal DDS have a resolution of more than one bit.

The communication unit 3 feeds the digital payload signal DDS to the equalizer unit 12, which provides an equalized payload signal EDS based on the digital payload signal DDS and using the parameter set PS.

The communication unit 3 supplies the digital payload signal DDS and/or the equalized payload signal EDS to the parameter set unit 15, which provides, in particular calculates or selects, the parameter set PS on the basis of the digital payload signal DDS and/or the equalized payload signal EDS.

Exemplarily, the communication unit 3 further comprises an extraction unit 14 that extracts the payload from the equalized payload signal EDS and provides the payload to the function unit 2.

In the following, the determination of the cable wear condition will be discussed in more detail.

Preferably, the diagnosis device 5 is designed to perform a selection and/or a weighting of the parameters of the parameter set and to provide, in particular to calculate, the indicator variable IG on the basis of the selected and/or weighted parameters. For example, the system 10, in particular the diagnosis device 5, determines the selection and/or weighting of the parameters to be used for the indicator variable IG during commissioning. In particular, those parameters that have a stronger correlation to cable wear than other parameters are selected and/or weighted more than the other parameters for providing the indicator variable IG. In particular, the indicator variable IG may be a scalar or a vector quantity. Expediently, the diagnosis device 5 is designed to provide, in particular to calculate, the indicator variable IG continuously on the basis of the set of parameters changing over time. The indicator variable IG is provided in particular as an indicator variable signal that changes over time.

Preferably, the diagnosis device 5 is configured to calculate the indicator variable IG as a function of the parameter set. For example, the indicator variable IG is based on a single, several or all parameters of the parameter set. Preferably, the indicator variable IG is based on a sum of several or all parameters of the parameter set. In particular, the indicator variable IG is based on a sum of the selected parameters of the parameter set. Further, it is possible for the indicator variable IG to represent a single parameter, a plurality of parameters, or all parameters of the parameter set. For example, the parameter set itself can also be used as indicator variable IG.

Preferably, the diagnosis device 5 has a reference value and is configured to compare the indicator variable IG with the reference value to determine the cable wear condition. For example, the system 10 is adapted to record the reference value when the system 10 is put into operation, i.e. in particular when the cable 4 is new and does not show any wear.

Preferably, the diagnosis device 5 is configured to calculate a change in the indicator variable IG and to determine the cable wear condition based on the change. For example, the diagnosis device 5 is designed to calculate the first time derivative and/or the second time derivative of the indicator variable IG and to determine the cable wear condition on the basis of the first time derivative and/or the second time derivative.

The diagnosis device 5 is expediently designed to determine the cable wear condition during ongoing operation, i.e. in particular during an ongoing industrial manufacturing process carried out with the system 10. The diagnosis device 5 is expediently designed to provide the indicator variable IG on the basis of a parameter set provided during ongoing operation and to determine the cable wear condition on the basis of the indicator variable IG.

Preferably, the diagnosis device 5 is designed to provide cable wear information based on the determined cable wear condition, in particular to store, to transmit and/or to output the cable wear information to a user, for example to display the cable wear information on a display. The cable wear information indicates, for example, that the cable 4 whose cable wear condition has been determined is to be replaced. For example, the cable wear information is displayed by a field device 1, in particular in a manner perceptible by a user, for example visually and/or acoustically. For example, the field device 1 comprises a display, in particular a display and/or an LED, with which the field device 1 displays the cable wear information.

Preferably, the diagnosis device 5 is designed to provide the cable wear information indicating that a cable 4 needs to be replaced at a time when the cable 4 can still transmit the payload signal DS well enough that the communication unit 3 can completely extract the payload ND transmitted with the payload signal DS from the payload signal DS, so that in particular no payload ND is lost.

Preferably, the diagnosis device 5 is designed to provide, in particular to calculate, a remaining service life forecast on the basis of the determined cable wear condition. Expediently, the diagnosis device 5 is designed to store, transmit and/or output the remaining service life forecast as forecast information, in particular to display it to a user.

Exemplarily, the external computer unit 7, in particular designed as a mobile device, is configured to display the determined cable wear condition of one or more cables 4, in particular on a display of the external computer unit 7.

Exemplarily, the actuator device 8 is designed to perform a movement 9 by which the cable 4 is set into a cable movement. Exemplarily, the actuator device 8 is provided in addition to the field device 1 and sets the field device 1 in movement, thereby setting the cable 4 into the cable movement. Alternatively, the actuator device may be part of the field device; for example, the actuator device may be the function unit of the field device, and the actuator device sets the cable 4 into the cable movement.

The cable 4 can expediently be guided in a cable guide, for example a drag chain and/or energy guiding chain.

In particular, the actuator device 8 is configured to provide the movement 9 as a periodically repeating movement, so that the cable 4 is set into a periodically repeating cable movement.

The cable movement expediently results in wear of the cable. In particular, the cable movement results in a mechanical stress that leads to aging. In particular, the cable movement causes a change in the geometry and/or dielectric of the cable 4.

Preferably, the diagnosis device 5 is configured to detect movement information about the cable movement and to take the movement information into account when determining the cable wear condition. The movement information indicates, for example, when a cable movement occurs. Expediently, the parameter set PS—and thus also the indicator variable IG—is subject to a change over time, in particular due to the cable movement.

Figure 3:
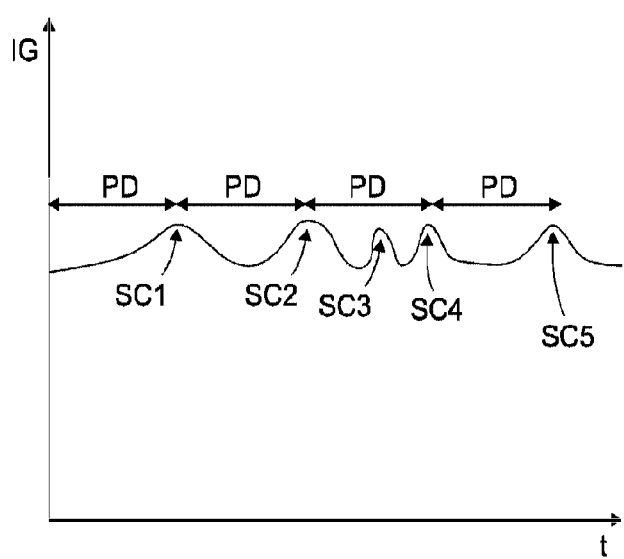

FIG. 3 shows an exemplary temporal course of the indicator variable IG. The temporal course of the indicator variable IG shall also be called indicator variable signal. The indicator variable signal has a plurality of signal characteristics SC, which are exemplary local maxima. Alternatively, the signal characteristics may be minima or other characteristic features of the indicator variable signal. Exemplarily, the cable 4 associated with the indicator variable signal shown is subject to a periodic motion with a period duration PD.

Preferably, for determining the cable wear condition, the diagnosis device 5 is configured to select from the indicator variable signal those indicator variable signal values and/or to weight them more strongly than other indicator variable signal values for which indicator variable signal values a specific cable movement and/or a specific deformation of the cable 4 caused by the cable movement is present. Expediently, the diagnosis device 5 is configured to recognize, on the basis of the movement information, for each indicator variable signal value, whether the specific cable movement and/or the specific cable deformation is present for this indicator variable signal value, and to select, reject and/or weight the indicator variable signal value on the basis of this recognition. In particular, the diagnosis device is adapted to determine the cable wear condition based on the selected and/or weighted indicator variable signal values.

Exemplarily, the movement information comprises, for example, the period PD of the cable movement. The diagnosis device 5 is expediently configured to take into account those signal characteristics that correlate with the movement information, in particular the period PD, as indicator variable signal values when determining the cable wear condition. Exemplarily, several signal characteristics—here, for example, the signal characteristics SC1, SC2, SC4, SC5—have the period PD as a time interval between them. The diagnosis device 5 determines that these signal characteristics SC1, SC2, SC4, SC5 correspond to the movement information and uses the indicator variable signal values associated with these signal characteristics in determining the cable wear condition. Furthermore, the diagnosis device 5 is expediently configured to determine that the signal characteristic SC4 does not correspond to the movement information, and to disregard the indicator variable signal values associated with the signal characteristic SC4 when determining the cable wear condition, or to weight them more weakly than other indicator variable signal values.

Exemplarily, the diagnosis device 5 can provide the movement information based on the payload ND, for example, if the payload ND comprises control data for the actuator device 8. Furthermore, the diagnosis device 5 may be configured to acquire the movement information based on the parameter set and/or the indicator variable, in particular based on a temporal change of the parameter set and/or the indicator variable. For example, the diagnosis device 5 is configured to detect a periodic change in the parameter set and/or the indicator variable and to provide the movement information on the basis of this periodic change. The movement information expediently relates to a periodicity, in particular a period, of the cable movement.

Preferably, the diagnosis device 5 is configured to count a number of cable movements as the movement information. The diagnosis device 5 is configured to calculate a number of switching cycles, in particular of the actuator device 8, on the basis of the movement information.

Preferably, the system 10 comprises a plurality of field devices 1. Each field device 1 has a respective communication unit 3, which is configured to receive a respective payload signal DS via a respective cable 4, to provide a respective parameter set PS according to the respective payload signal DS, and to perform signal processing of the payload signal DS using the respective parameter set PS in order to obtain respective payload ND contained in the respective payload signal DS. The system 10, in particular the diagnosis device 5, is configured to determine for each cable 4 a respective cable wear condition according to a respective indicator variable based on the respective parameter set.

For example, the diagnosis device 5 determines a first cable wear condition for the first cable 4A according to a first indicator variable based on a first parameter set used by the first field device 1A for signal processing of a first payload signal received via the first cable 4A. Further, the diagnosis device 5 determines a second cable wear condition for the second cable 4B according to a second indicator variable based on a second parameter set used by the second field device 1B for signal processing of a second payload signal received via the second cable 4B. Further, the diagnosis device 5 determines a third cable wear condition for the third cable 4C according to a third indicator variable based on a third parameter set used by the third field device 1C for signal processing of a third payload signal received via the third cable 4C. Further, the diagnosis device 5 determines a fourth cable wear condition for the fourth cable 4D according to a fourth indicator variable based on a fourth parameter set used by the fourth field device 1D for signal processing of a fourth payload signal received via the fourth cable 4D.

Preferably, the system 10 is configured to determine the cable wear condition of the first cable 4A connected to the first field device 1A based on the first indicator variable associated with the first field device 1A (which is based on the first parameter set) and based on the second indicator variable associated with the second field device 1B (which is based on the second parameter set). For example, the system 10, in particular the diagnosis device 5, is configured to take into account the indicator quantities and/or parameter sets associated with the other cables 4 when determining the cable wear condition of a cable 4, in particular as reference quantities. For example, the system 10, in particular the diagnosis device 5, is configured to detect that the indicator variable of a first field device 1A changes to a greater extent compared to the indicator quantities of other field devices, and to determine the cable wear condition of the first cable 4A connected to the first field device 1A based on this detection. The system 10, in particular the diagnosis device 5, is adapted to determine the cable wear condition according to a change over time of the first indicator variable relative to a change over time of the second indicator variable.

Preferably, the system 10 has property information for each cable 4, including type information of the respective cable and/or load information of the respective cable. The system 10 is configured to determine the cable wear condition taking into account the property information. Exemplarily, the system is configured to group the cables 4 into different cable groups based on the respective property information and to determine the respective cable wear condition of each cable 4 taking into account the respective cable group. Exemplarily, the diagnosis device 5 is configured to adjust a reference value according to a respective cable group and to determine the cable wear condition based on a comparison of the indicator variable with the adjusted reference value.

Preferably, the diagnosis device 5 is configured to combine the indicator variables of different field devices 1, for example in the external diagnosis unit 18, and preferably to subject them to a Big Data analysis. Expediently, the diagnosis device 5 is configured to train an AI component, for example an artificial neural network, on the basis of the indicator variables, in particular on the basis of the Big Data analysis, and to use it in determining the cable wear condition.

In particular, the system 10 may be operated in accordance with the method described below for determining a cable wear condition of a cable 4. The method comprises the steps of: receiving, at a field device 1, a payload signal DS, providing a parameter set PS based on the payload signal DS, performing signal processing of the payload signal DS using the parameter set PS to obtain a payload ND from the payload signal, by means of a function unit 2, in particular an actuator unit, sensor unit and/or control unit, of the field device 1, providing a function according to the payload, and determining a cable wear condition of the cable 4 according to an indicator variable based on the parameter set PS.

Further exemplary details are to be explained below.

The parameter set can include, for example, parameters of an automatically set preamplification, operating parameters of signal equalizers, the degree of crosstalk of an output port to an input port of the communication unit 3, statistical signal parameters, error indicators of the bus protocol such as CRC errors, and/or error indicators of the symbol coding. Expediently, the diagnosis device 5 is configured to continuously evaluate the coefficients from the equalizer unit 12 and/or further system parameters of the transmission path running over the cable 4 during operation and to analyze the temporal course in order to determine the cable wear condition.

The parameters of the parameter set are preferably continuously changing variables. The diagnosis device 5 is expediently configured to subject the parameter set and/or the indicator variable to averaging and/or filtering (e.g. by means of a median filter), in particular to reduce or remove short-term disturbances or measurement errors. In particular, the diagnosis device 5 employs a time-based filter that converts a countable quantity into a continuously variable quantity. Optionally, the diagnosis device 5 is designed to weight and/or time filter the parameters of the parameter set according to their relationship with the transmission property, for example the transmission quality, of the cable 4 when calculating the indicator variable. Exemplarily, the diagnosis device 5 is configured to determine the weighting of the error in the determination of the indicator variable depending on the protocol layer in which an error occurs, in particular such that an error of a higher protocol layer is weighted weaker than an error in a lower protocol layer. For example, a CRC error may indicate an external electromagnetic interference and be weighted weaker accordingly.

In particular, the cable 4 is arranged in a drag chain which, by way of example, is subject to a cyclic sequence of movements, so that the cable 4 experiences a cyclic mechanical load. The diagnosis device 5 is expediently designed to measure the period duration between disturbance events of a parameter of the parameter set and, if the period duration is constant, to conclude that the disturbance events are caused by the mechanical load (and not, for example, by an external electromagnetic disturbance) and to include the parameter in the indicator variable IG. Expediently, the diagnosis device 5 is configured to detect, in this way, disturbance patterns, which recur in a temporal filtering.

Preferably, the diagnosis device 5 is configured to perform a relative comparison of indicator variables that are assigned to different field devices 1 and/or cables 4 in order to determine the cable wear condition. Alternatively or additionally, the diagnosis device 5 is configured to perform a comparison with a (in particular absolute) reference value to determine the cable wear condition.

Exemplarily, the diagnosis device 5 is configured to perform a distributed, system-wide evaluation procedure of the parameter sets and/or indicator variables. Preferably, the diagnosis device 5 is configured to determine the determination of the respective cable wear conditions locally, i.e. in each field device 1 relative to a reference value, e.g. the new condition and/or a reference value determined in advance from corresponding random samples.

Preferably, the system 10 comprises a number N of cables 4 (exemplarily four cables 4). Of these N cables 4, exemplarily a number M of cables (exemplarily three cables: the first cable 4A, the second cable 4B and the third cable 4C) are subjected to a particular load—exemplarily movement 9. It can be assumed that with the increase of the operating time the M cables age faster compared to the N-M unloaded cables (exemplarily the cable 4D); thus the rate of change of the indicator variables of the M cables differs from the rate of change of the N-M unloaded cables.

Expediently, the diagnosis device 5 is configured to determine an expectation corridor for the indicator variable in the new condition, in particular corresponding to the cable length, and to determine the cable wear condition on the basis of the expectation corridor. The expectation corridor is an example of the reference value.

In particular, the diagnosis device 5 is configured to determine, in response to the fact that the indicator variable of the cable 4 is outside the expected corridor, damage as the cable wear condition and/or to infer incorrect assembly and expediently to provide, in particular to output, information to this effect.

Exemplarily, the diagnosis device 5 is configured to detect an incorrectly tightened connector screw connection on the basis of the indicator variable and to provide corresponding information.

Preferably, the diagnosis device 5 is configured to perform the determination of the cable wear condition of a single, independent cable 4 based on a comparison with a reference value and/or a comparison of the indicator variable in the new condition at initial start-up.

In particular, the diagnosis device 5 is configured to continuously evaluate the coefficients from the equalizer unit 12 and optionally other system parameters related to the cable 4 during operation and to analyze the temporal course.

Optionally, the diagnosis device 5 is configured to assign a load profile (e.g. with respect to a bending, torsion, temperature and/or humidity) to each cable 4 in order to adjust an expectation corridor(s) according to the load profile. The diagnosis device 5 compares the adjusted expectation corridor to the indicator variable to determine the cable wear condition. The load profile is an example of load information.

Expediently, the diagnosis device 5 is configured to compare, starting from an initial state of the system 10, the indicator variables and/or parameter sets of the cables 4 (leading to different field devices 1) with each other—as a whole or segmented into groups.

The cables 4 assigned to the same group are located at the same place (one machine or several identical machines which are operated in parallel) and/or experience similar operating conditions (same room/location). It can be assumed that the cables 4 assigned to a same group are each subject to similar wear among themselves. Expediently, the system 10 is designed to assign cables 4 that are subject to a particularly high load to one or more groups.

Preferably, the diagnosis device 5 is configured to detect one of the indicator variables as an outlier on the basis of several indicator variables that are assigned to different cables 4, in particular different cables 4 of the same group, and to determine a cable wear condition for the associated cable on the basis of this detection. As an example, the indicator variable detected as an outlier is still within the expected corridor of (in particular absolute) reference values.

Preferably, the diagnosis device 5 is configured to observe the cable 4 associated with the indicator variable detected as an outlier with a narrower corridor of expectation and/or to provide cable wear information for this cable 4 requesting replacement of the cable 4.

The monitoring of the cables 4 can be carried out locally and/or centrally. Expediently, the diagnosis device 5 is configured to perform a determination of a cable wear condition of a cable 4 locally (in particular independently of the indicator variables of other cables). Furthermore, the diagnosis device 5 is configured to perform a determination of the cable wear condition centrally on the basis of indicator variables and/or parameter sets from various field devices. Exemplarily, the diagnosis device 5 is configured to perform a provision and/or processing, for example a filtering, of the respective indicator variable and/or the respective parameter set locally in the respective field device 1 and to transmit the indicator variables and/or parameter sets of the field devices 1 to the central diagnosis unit 17 and/or the external diagnosis unit 18, in particular cyclically and/or in the event of a change.

Preferably, the system components of the system 10 that have an influence on the transmission quality via the cable 4 are versioned. These system components include, for example, the cables 4 and the field devices 1, in particular their communication units 3. The diagnosis device is expediently designed to provide different reference values for different versions and combinations of the system components. In particular, the diagnosis device 5 is configured to transmit new, extended or corrected reference values to the field devices 1 and/or the central diagnosis unit 17 and/or the external diagnosis unit 18.

Expediently, the diagnosis device 5 is configured to record the indicator variables of the field devices 1 and to generate an expectation corridor for determining the cable wear condition based on the recorded indicator quantities, and expediently to use the expectation corridor for determining a cable wear condition of a newly added cable 4.

According to a further embodiment, a system 10 for industrial automation is provided that comprises a field device 1 with a function unit 2, in particular an actuator unit, sensor unit and/or control unit. The function unit 2 is configured to provide a function according to a received payload ND. The field device 1 further comprises a communication unit 3 for receiving a payload signal DS containing the payload ND via a cable 4. The system 10 further comprises a diagnosis device 5 having a machine learning model that maps an indicator variable related to the payload signal DS to a cable wear condition of the cable 4. The diagnosis device 5 is adapted to determine the cable wear condition according to the indicator variable using the machine learning model.

The system 10 of this embodiment is preferably the system 10 described above. Preferably, the indicator variable is based on the parameter set PS used for signal processing of the payload signal DS. Alternatively or additionally, the indicator variable may relate to another quantity related to the payload signal DS, for example a signal-to-noise ratio of the payload signal DS.

The machine learning model in particular represents a mapping of the indicator variable, in particular one or more parameters of the parameter set, to the cable wear condition. In particular, the machine learning model approximates a non-linear relationship between the indicator variable, in particular one or more parameters of the parameter set, and the cable wear condition. Preferably, the machine learning model comprises and/or is based on one or more of the following: a decision tree, an ensemble method, random forest, gradient boosted tree, support vector machine, neural network, regression method, regularization, ridge regression, lasso regression, and/or Bayesian network. In particular, the machine learning model is an artificial intelligence model. In particular, the machine learning model comprises and/or is based on one or more of the following: a decision tree, an ensemble method such as random forest or gradient boosted trees, a support vector machine, a neural network, a regression method with regularization such as ridge regression or lasso regression, a Bayesian network and/or other regression or classification algorithms According to a possible embodiment, the indicator variable comprises a signal-to-noise ratio of the received payload signal and the machine learning model maps the signal-to-noise ratio (and expediently the parameter set) to the cable wear condition. The diagnosis device 5 is adapted to determine the cable wear condition based on the signal-to-noise ratio (and expediently the parameter set) using the machine learning model. The signal-to-noise ratio is determined, for example, by the communication unit 3, in particular when receiving the payload signal DS. The signal-to-noise ratio is in particular the signal-to-noise ratio of the payload signal DS.

Preferably, the diagnosis device 5 is configured to determine, as the cable wear condition, an cycle number estimate value describing an estimated number of cycles of cable movement of the cable 4. By the term "cycle number", the number of cable movements that have occurred—in particular, the number of cycles of movement of the cable 4—is meant. The cable wear condition is a measure of the aging of the cable 4 and is expressed, for example, in the unit "cycles". Alternatively, the cable wear condition is expressed in the unit "percent", in particular as an already elapsed lifetime. The cycle number estimate may also be referred to as the aging cycle number. Preferably, the machine learning model maps the indicator variable, in particular the parameter set and/or the signal-to-noise ratio, to the cycle number estimate value (as the cable wear condition). Exemplarily, the cable wear information provided by the diagnosis device 5 comprises the cycle number estimate value and/or a lifetime, in particular remaining lifetime, determined based on the cycle number estimate value. In particular, the cable wear information may comprise a warning to the user that the cable 4 is to be replaced.

According to a preferred embodiment, the diagnosis device 5 is configured to determine a relative cable wear condition based on the cycle number value estimate and a cycle number count value describing the actual number of cycles of the cable movement of the cable, which relative cable wear condition takes into account a relationship between the estimated cycle number value and the cycle number count value. For example, the system 10 determines the actual cycle number of the cable movement on the basis of a sensor signal, in particular a movement sensor, for example from the actuator device 8, and/or on the basis of a control of the actuator device 8. Preferably, the diagnosis device 5 calculates the relative cable wear condition as the ratio of the cycle number estimate value and the cycle number count value—that is, in particular, as the quotient of the cycle number estimate value and the cycle number count value. In particular, the diagnosis device 5 is configured to compare the cycle number estimate value and the cycle number count value with each other and to determine the relative cable wear condition based on the comparison. For example, if the cycle number estimate value is larger than the cycle number count value, then the diagnosis device 5 may indicate (e.g., as the cable wear information) that the wear of the cable 4 is higher than normal, in particular higher than in the reference test bench. For example, if the cycle number estimate value is lower than the cycle number count value, then the diagnosis device 5 may indicate (e.g., as the cable wear information) that the wear of the cable 4 is lower than normal.

In particular, the diagnosis device 5 is configured to determine a service life, in particular remaining service life, and/or a load of the cable 4 on the basis of the relative cable wear condition. Preferably, the cable wear information comprises the determined service life and/or the load. In particular, the load is a measure of how fast the cable 4 wears out. Preferably, the determined load is provided as a wear rate. Further, the load may indicate how much stress is placed on the cable. For example, the load is determined in the form of a stress indicator.

The diagnosis device 5 can be implemented at different locations, as already explained above. Preferably, the diagnosis device 5 may be implemented in a fieldbus node. In particular, the diagnosis device may be implemented in an edge computing device. Further, the diagnosis device 5 may be integrated in a bus master. Furthermore, the diagnosis device 5 may be implemented in the cloud.

In the following, the operation of the diagnosis device 5 will be discussed in more detail.

In operation, the diagnosis device 5 repeatedly performs an aggregation of input data, in particular over a defined time window. The input data comprises, for example, one or more parameters of the parameter set and/or the signal-to-noise ratio. The diagnosis device 5 determines, for example, an average value, a minimum and/or a maximum of the input data. The system 10, in particular the diagnosis device 5, is configured to perform the aggregation within a periodically repeating time window, in particular exclusively within the periodically repeating time window. The time window is, for example, less than one hour or several hours long and the interval between two directly successive time windows is, for example, greater than one hour. Furthermore, it is possible that there is no interval between successive time windows.

Optionally, the diagnosis device 5 performs a processing of the input data. For example, the diagnosis device 5 filters out outliers and/or sorts out irrelevant input data.

Optionally, the diagnosis device 5 calculates an influence of an EMC environment (EMC=electromagnetic compatibility) on the input data. The input data is thus cleaned of the influence of the EMC environment. This serves in particular to improve comparability.

Preferably, the diagnosis device 5 feeds the input data (processed in particular as explained above)—which comprises, for example, the indicator variable, in particular the parameter set and/or the signal-to-noise ratio—to the machine learning model as input variables. The machine learning model calculates the cable wear condition, for example the cycle number estimate value, on the basis of these input variables, i.e. in particular on the basis of the parameter set and/or the signal-to-noise ratio. The cable wear condition may be expressed by one or more numbers. Further, the cable wear condition may be expressed as a probability distribution (for example, a probability distribution over the cycle number).

Optionally, the diagnosis device 5 is further configured to perform smoothing of the cycle number estimate value, for example by the diagnosis device 5 forming a moving average of the cycle number estimate value.

In the following, it is discussed in more detail how the machine learning model can be trained.

Exemplarily, the machine-learning model is trained in a laboratory and/or test environment, in particular before the machine-learning model is put into operation in the system 10. During training of the machine-learning model, the machine-learning model is preferably supplied with one or more equalizer parameters and/or the signal-to-noise ratio, on the basis of which the machine-learning model calculates a cycle number estimate value. The equalizer parameters and/or signal-to-noise ratio are expediently obtained from a test setup in which one or more cables are subjected to a plurality of movement cycles in a continuous run. The calculated cycle number estimate value is compared with a cycle number count—i.e., the actual cycle number—and based on the comparison, model parameters of the machine learning model are adjusted, in particular such that the difference between the cycle number estimate value and the cycle number count is reduced, in particular minimized.

Furthermore, it is possible that the machine learning model is further trained in operation in the system 10. The machine learning model can thus be provided, for example, as a pre-trained model and, in particular, be further trained on site by meta-learning, for example on the basis of an EMC environment, in particular with regard to the final layers of the machine learning model.

Further possible embodiments will be explained below.

For example, for the training of the machine learning model, several million movement cycles are run in the continuous run of a drag chain setup and cable parameters—in particular the equalizer parameters and/or the signal-to-noise ratio—are measured. Furthermore, an algorithm—the machine learning model—is trained to assign to each cable its current degradation state in the form of a cycle number estimate—the cycle number estimate value—with respect to the cables of the continuous run. The cycle number estimate value expresses that a cable has the same wear condition as a reference cable that has undergone a number of actual movement cycles equal to the cycle number estimate value. The cycle number estimate value can also be referred to as the equivalent cycle number.

To calculate the cycle count estimate value, the machine learning model combines several cable parameters—in particular, the equalizer parameters and/or the signal-to-noise ratio.

Expediently, a reference service life is stored in the diagnosis device 5, which indicates, for example, a normal service life of a cable, in particular in the unit "movement cycles". The diagnosis device 5 is expediently configured to calculate, on the basis of the reference service life and on the basis of the cycle number estimate value, how long the cable can still be used and/or whether the cable should be replaced, and preferably to provide corresponding cable wear information. Exemplarily, the diagnosis device 5 is configured to take into account how long the cable has been in use. A corresponding information is recorded by the system 10.

As the aforementioned algorithm—i.e. as the machine learning model—basically any regression algorithm of machine learning can be considered. In particular, this includes any form of decision trees (regression trees) including ensemble methods, such as random forest and gradient boosted trees. Furthermore, support vector machines, neural networks and/or regression methods with regularization such as ridge regression or Lasse regression can be used. In addition, Bayesian networks and other methods that express a probability about the predicted value—for example, the cycle number estimate value—can be used.

Since no abrupt change in the cable condition is to be expected, the measurement parameters—i.e. the above-mentioned input data—are aggregated over a certain period of time—the above-mentioned time window—and then used for the prediction. The prediction value refers, for example, to the entire aggregation period and represents a mean cycle number estimate. Data aggregation can be performed per hour, but other time periods can also be selected. For the data aggregation, typically mean values, minima and maxima of the measured parameters are formed over the defined time windows.

Optionally, a preceding processing step takes place which establishes the comparability of an individual cable to the continuous run cables. In particular, interfering radiation could cause changes in the measurement parameters—for example, the equalizer parameters and/or the signal-to-noise ratio. This could prevent the transferability of the cable models, which is why the cleaning of data in changed EMC environments can be beneficial.

Optionally, further pre- and post-processing steps can be performed. During preprocessing, outliers can be eliminated or missing sensor values can be interpolated using neighboring values. As a post-processing step, the cycle number estimate value can be smoothed in particular to dampen short-term fluctuations. In particular, a moving average filter can be used for this purpose.

Thus, the determination of the cable wear condition may include, in particular, the following steps: Aggregation, pre-processing, establishing comparability, calculating the cycle number estimate value (=equivalent cycle number) and post-processing. Of these, the aggregation and the calculation of the cycle number estimate are expediently required and the other steps may optionally be omitted.

The determination of the cable wear condition can be executed on the field device and/or on an edge device. Since the memory space and the computing capacity on the field device are usually limited, it is recommended to run it on the field device if the number of cables to be monitored is low, and it is preferable to switch to an edge device if the number is higher.

Preferably, the measurement experience from continuous runs with drag chains and current values are combined. In this way, the actual wear of the cable (aging) is detected in an ideal case. Expediently, various parameters such as kinematic quantities (bending radius, movement speed, . . . ) as well as environmental parameters (temperature, . . . ) can be taken into account via the measured parameters of the transmission line in relation to the reference data. This predictive approach can lead to higher plant availability by avoiding unplanned downtimes and, moreover, maintenance can be planned according to demand (predictive maintenance).

The invention claimed is:

1. A system for industrial automation, the system comprising:
   a cable;
   an actuator device adapted to perform a movement by which the cable is set into a cable movement;
   a field device having a function unit and a communication unit, the function unit being designed as an actuator unit, a sensor unit or a control unit and being further configured to provide a function in accordance with a received payload, and the communication unit being configured for receiving a payload signal containing the payload via the cable, wherein the communication unit comprises an equalizer unit and is configured to provide a parameter set on the basis of the payload signal, wherein the equalizer unit is configured to carry out signal equalization of the payload signal using the parameter set in order to obtain the payload from the payload signal; and
   a diagnosis device the diagnosis device being configured to determine a cable wear condition of the cable in accordance with an indicator variable based on the parameter set,
   wherein the diagnosis device is configured to detect movement information about the cable movement and to take the movement information into account when determining the cable wear condition, and
   wherein the diagnosis device is adapted to detect the movement information based on the indicator variable.

2. The system according to claim 1, wherein the movement information relates to a periodicity of the cable movement and/or a number of cable movements.

3. The system according to claim 1, wherein the system comprises a plurality of field devices and each field device has a respective communication unit which is configured to receive a respective payload signal via a respective cable, to provide a respective parameter set according to the respective payload signal, and to carry out signal processing of the payload signal using the respective parameter set, to obtain a respective payload contained in the respective payload signal, and wherein the system is adapted to determine for each cable a respective cable wear condition according to a respective indicator variable based on the respective parameter set.

4. The system according to claim 3, wherein the system is adapted to determine the cable wear condition of a first cable connected to a first field device based on a first indicator variable associated with the first field device and based on a second indicator variable associated with a second field device.

5. The system according to claim 4, wherein the system is adapted to determine the cable wear condition of the first cable according to a change over time of the first indicator variable relative to a change over time of the second indicator variable.

6. The system according to claim 3, wherein the system has, for each cable, property information comprising type information of the respective cable and/or load information of the respective cable, and wherein the system is adapted to determine the cable wear condition taking into account the property information.

7. The system according to claim 6, wherein the system is adapted to group the cables into different cable groups based on the respective property information and to determine the respective cable wear condition of each cable taking into account the respective cable group.

8. The system according to claim 1, wherein the diagnosis device has a machine learning model, which maps the indicator variable to the cable wear condition and is adapted to determine the cable wear condition using the machine learning model.

9. The system according to claim 8, wherein the machine learning model comprises and/or is based on a decision tree, ensemble method, random forest, gradient boosted tree, support vector machine, neural network, regression method, regularization, ridge regression, lasso regression, and/or a Bayesian network.

10. The system according to claim 8, wherein the diagnosis device is adapted to determine, as the cable wear condition, a cycle number estimate value describing an estimated number of cycles of cable movements carried out.

11. The system according to claim 10, wherein the diagnosis device is adapted to determine, based on the cycle number estimate value and a cycle number count value describing the actual number of cycles of cable movement of the cable, a relative cable wear condition, which takes into account a relationship between the cycle number estimate value and the cycle number count value.

12. The system according to claim 11, wherein the diagnosis device is configured to determine a service life and/or a load of the cable based on the relative cable wear condition.

13. The system according to claim 1, wherein the parameter set comprises coefficients and the equalizer unit is configured to use the coefficients for equalizing the payload signal.

14. The system according to claim 13, wherein each coefficient is associated with a respective frequency band and describes the amplification of the frequency band to be performed by the equalizer unit.

15. A system for industrial automation, the system comprising:
- a field device with a function unit, the function unit being designed as an actuator unit, a sensor unit or a control unit, wherein the function unit is designed to provide a function according to a received payload, wherein the field device further comprises a communication unit for receiving a payload signal containing the received payload via a cable; and
- a diagnosis device having a machine learning model, wherein the machine learning model maps a signal-to-noise ratio of the received payload signal to a cable wear condition of the cable, and the diagnosis device is configured to determine the cable wear condition based on the signal-to-noise ratio using the machine learning model.

16. A method for determining a cable wear condition of a cable of a system for industrial automation, wherein the system comprises an actuator device and a cable, wherein the actuator device performs a movement by which the cable is set into a cable movement, wherein the system further comprises a field device with a function unit, wherein the function unit is designed as an actuator unit, a sensor unit or a control unit, and wherein the field device further comprises a communication unit, wherein the communication unit comprises an equalizer unit, wherein the system further comprises a diagnosis device, the method comprising the steps of:
- the communication unit receiving, via a cable, a payload signal containing the payload;
- the communication unit providing a parameter set based on the payload signal;
- the equalizer unit performing a signal equalization of the payload signal using the parameter set to obtain the payload from the payload signal;
- the function unit providing a function according to the payload; and
- the diagnosis device determining the cable wear condition of the cable according to an indicator variable based on the parameter set,
- wherein the diagnosis device has a machine learning model, which maps the indicator variable to the cable wear condition and is adapted to determine the cable wear condition using the machine learning model.

* * * * *